United States Patent
Luo et al.

(10) Patent No.: US 10,354,716 B2
(45) Date of Patent: Jul. 16, 2019

(54) SRAM BASED MEMORY STRUCTURES AND METHODS THEREOF

(71) Applicant: Aspiring Sky Co. Limited, Hong Kong (CN)

(72) Inventors: Zhijiong Luo, Hopewell Township, PA (US); Xiaoming Jin, Shanghai (CN); Shu Wang, Shanghai (CN)

(73) Assignee: Aspiring Sky Co. Limited, Hong Kong (CN)

( * ) Notice: Subject to any disclaimer, the term of this patent is extended or adjusted under 35 U.S.C. 154(b) by 0 days.

(21) Appl. No.: 15/704,006

(22) Filed: Sep. 14, 2017

(65) Prior Publication Data

US 2018/0082732 A1  Mar. 22, 2018

Related U.S. Application Data

(60) Provisional application No. 62/395,581, filed on Sep. 16, 2016.

(51) Int. Cl.
| | |
|---|---|
| *G11C 11/408* | (2006.01) |
| *G11C 5/02* | (2006.01) |
| *G11C 7/12* | (2006.01) |
| *G11C 7/18* | (2006.01) |
| *G11C 8/08* | (2006.01) |
| *G11C 11/419* | (2006.01) |
| *G06F 12/02* | (2006.01) |
| *G06F 12/06* | (2006.01) |

(Continued)

(52) U.S. Cl.
CPC ...... *G11C 11/4085* (2013.01); *G06F 12/0246* (2013.01); *G06F 12/0638* (2013.01); *G06F 13/1694* (2013.01); *G11C 5/025* (2013.01); *G11C 7/12* (2013.01); *G11C 7/18* (2013.01); *G11C 8/08* (2013.01); *G11C 8/10* (2013.01); *G11C 11/419* (2013.01); *G11C 14/0063* (2013.01); *G06F 2212/1016* (2013.01); *G06F 2212/1028* (2013.01); *G06F 2212/205* (2013.01); *G06F 2212/7203* (2013.01); *G11C 11/418* (2013.01); *G11C 14/00* (2013.01); *G11C 16/08* (2013.01); *Y02D 10/13* (2018.01); *Y02D 10/14* (2018.01)

(58) Field of Classification Search
CPC ....... G11C 11/4085; G11C 5/025; G11C 7/12; G11C 7/18; G11C 8/08; G11C 11/419; G11C 14/00
USPC ........ 365/185.05, 185.11, 185.17, 49.1, 154, 365/188, 189.011, 189.2, 189.08, 210.13, 365/230.01
See application file for complete search history.

(56) References Cited

U.S. PATENT DOCUMENTS 6,525,562 B1  2/2003  Schultz et al.
8,861,271 B1  10/2014  Zain
(Continued)

OTHER PUBLICATIONS

Single-chip Integration of SRAM and Non-volatile Memory using Bit-line sharing (2006 IEEE) 2006 Proceedings of the 32nd European Solid-State Circuits Conference, pp. 295-298.

*Primary Examiner* — Fernando Hidalgo
(74) *Attorney, Agent, or Firm* — Turk IP Law, LLC

(57) ABSTRACT

Technologies are generally described herein for static random access memory (SRAM) based memory structures and methods thereof such as multi-bit non-volatile static random-access memory (nvSRAM) with arrayed SRAM and NVM or SRAM buffered one time programmable (OTP) memories, RRAMs or other resistive RAMs.

13 Claims, 15 Drawing Sheets

(51) Int. Cl.
*G06F 13/16* (2006.01)
*G11C 8/10* (2006.01)
*G11C 14/00* (2006.01)
G11C 11/418 (2006.01)
G11C 16/08 (2006.01)

(56) References Cited

U.S. PATENT DOCUMENTS

| | | | |
|---|---|---|---|
| 9,318,196 B1 | 4/2016 | Kasai | |
| 9,349,440 B1 * | 5/2016 | Ma | G11C 11/56 |
| 9,473,204 B2 * | 10/2016 | Lin | H04B 3/20 |
| 9,640,256 B1 | 5/2017 | Roy | |
| 2003/0001615 A1 | 1/2003 | Sueyoshi et al. | |
| 2007/0297396 A1 | 12/2007 | Eldar | |
| 2013/0207170 A1 | 8/2013 | Kurokawa | |
| 2014/0085978 A1 | 3/2014 | Lee | |
| 2014/0368235 A1 | 12/2014 | Aoki et al. | |
| 2015/0348621 A1 * | 12/2015 | Sako | G11C 16/06 365/185.03 |
| 2016/0078938 A1 * | 3/2016 | Hsu | G11C 14/0063 365/185.08 |
| 2016/0173103 A1 | 6/2016 | Gao et al. | |

* cited by examiner

SRAM BASED MEMORY STRUCTURES AND METHODS THEREOF

CROSS REFERENCE TO RELATED APPLICATIONS

This application claims the benefit of U.S. Provisional Patent Application Ser. No. 62/395,581 filed on Sep. 16, 2016. The disclosures of the above application are hereby incorporated by reference for all purposes.

BACKGROUND

Unless otherwise indicated herein, the materials described in this section are not prior art to the claims in this application and are not admitted to be prior art by inclusion in this section.

Volatile semiconductor memories such as static random-access memory (SRAM) or DRAM may be utilized in computer design because of their relatively low power consumption, speed, and simple operation, while ion-volatile memories (NVM) such as one time programmable (OTP) memory, EEPROM, flash memory, or even PCM, have the advantage of storing configuration data, even when a flash-equipped device is powered on or off.

Many of today's system architectures, utilize both the volatile memory and the non-volatile memory devices, generally implemented separately. Because the memories devices are not in the same array layout, large area may be consumed by the system architecture. Further, it may reduce speed of transferring data from SRAM to NVM.

Accordingly, a need continues to exist for a relatively small non-volatile SRAM that consumes less power and improves transfer speed performance.

SUMMARY

Briefly stated, technologies are generally described herein for SRAM based memory structures and methods thereof such as multi-bit non-volatile static random-access memory (nvSRAM) with arrayed SRAM and NVM or SRAM buffered one time programmable (OTP) memories, RRAMs or other resistive RAMs.

In one configuration, a memory device is described. The memory device may include a static random access memory (SRAM) array having a plurality of SRAM cells and a non-volatile memory (NVM) array having a plurality of NVM cells, wherein the SRAM array and the NVM array arranged by rows of word lines and columns of bit lines. One or more of switch devices may be coupled between the SRAM array and the NVM array and configured to control connection between the static random access bit lines (BLs) and the non-volatile BLs.

Another configuration may be a method to operate a multi-bit non-volatile static random access memory device. Further embodiments are directed to SRAM buffered OTP memories and resistive RAMs.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
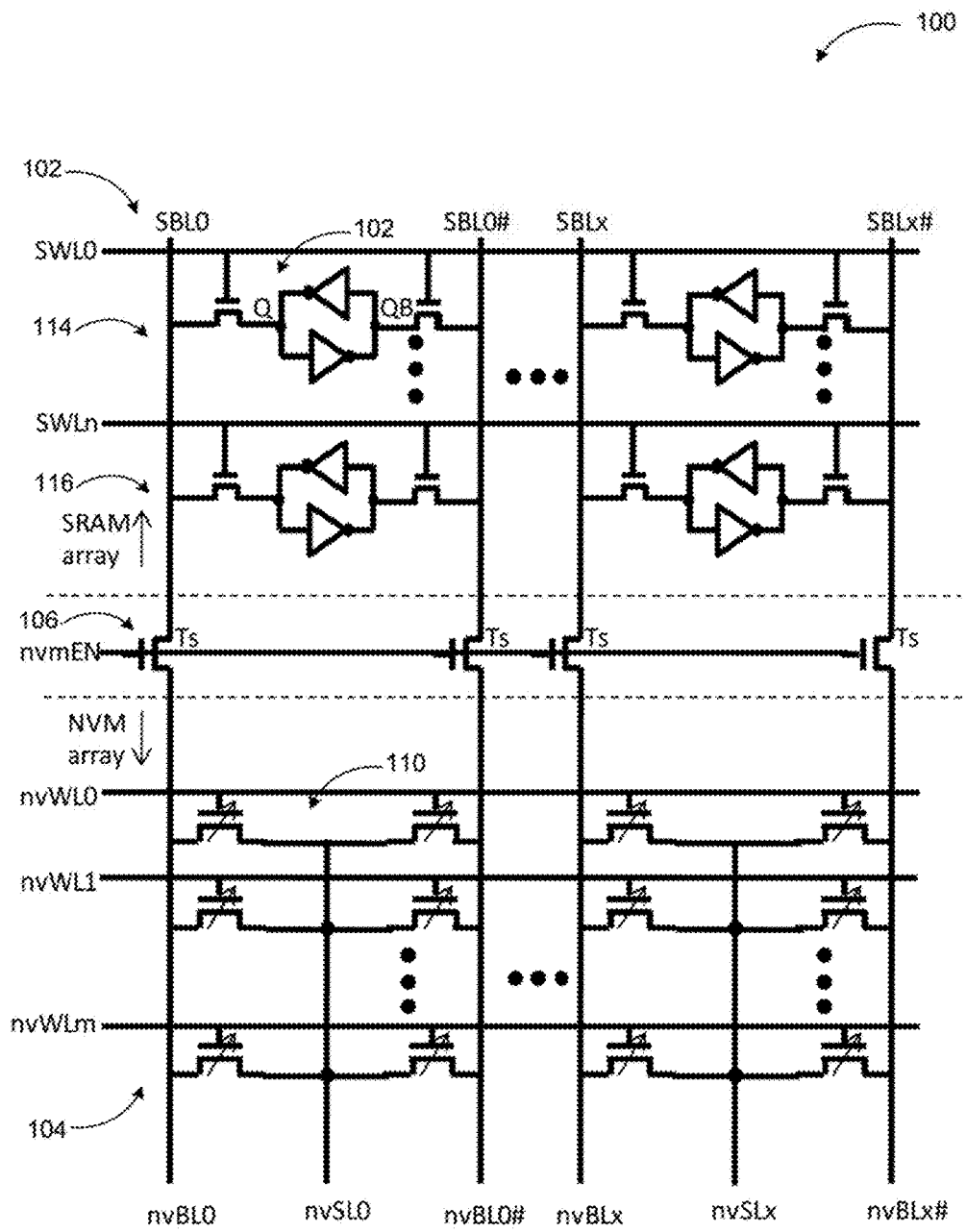
FIG. 1 is a schematic circuit diagram illustrating an example multi-bit nvSRAM device with arrayed SRAM and NVM.

all arranged according to at least some embodiments presented herein.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description and drawings are not meant to be limiting. Other embodiments may be utilized, and other changes may be made, without departing from the spirit or scope of the subject matter presented herein. The aspects of the present disclosure, as generally described herein, and illustrated in the figures, can be arranged, substituted, combined, separated, and designed in a wide variety of different configurations, all of which are explicitly contemplated herein.

This disclosure is generally drawn, inter alia, to technologies for a multi-bit non-volatile static random access memory (nvSRAM) device may include a static random access memory (SRAM) array having a plurality of SRAM cells and a non-volatile memory (NVM) array having a plurality of NVM cells, wherein the SRAM array and the NVM array arranged by rows of word lines and columns of bit lines. The nvSRAM device may also include one or more of switch devices coupled between the SRAM array and the NVM array and configured to control connection between the static random access bit lines (BLs) and the non-volatile BLs. The word lines run horizontally and may enabled to select one word of memory data, whereas bit lines run vertically and may connected to storage cells of different memory address. The disclosure is further directed to SRAM based memory structures and methods thereof such as SRAM buffered one time programmable (OTP) memories, RRAMs or other resistive RAMs.

As used herein, NVM memory may include, but is not limited to, a floating gate memory, a SONOS memory, a RRAM (resistive RAM), phase change memories, or magnetic base memories, such as MRAM, and STTRAM.

FIG. 1 is schematic circuit diagram illustrating an example multi-bit nvSRAM device 100 with arrayed SRAM and NVM cells, arranged in accordance with at least some embodiments described herein.

In FIG. 1, the circuit diagram 100 includes a SRAM array 102, a NVM array 104 and a switch device 106 coupled between the SRAM array and the NVM array. As illustrated in FIG. 1, the SRAM array 102 may have a plurality of SRAM memory cells identified as a first SRAM cell 114 and an nth SRAM cell 116. The first memory cell and the nth memory cell may provide two storage or logic states. More storage states than two storage states may also be implemented. Although FIG. 1 describes four SRAM memory cells, more than four memory cells may be used according to various configurations described herein. The SRAM array may be implemented in a matrix of n rows coupled to a plurality of word lines (e.g., first word line SWL0, nth word line SWLn, etc.) and x columns coupled to a plurality of bit lines (SBL0 to SBLx). In the memory array, each SRAM cell may have identical structure, that is, each vertical column of the SRAM cells may share a corresponding pair of bit lines SBL0 to SBL0#, and each horizontal row of the SRAM cells may share a corresponding word line SWL0.

The first SRAM cell 114 may be made up of two transistors and two cross-coupled inverters in some examples. Inverter I1 may include an input terminal coupled to a node QB and an output terminal coupled to a node Q. Inverter I2 may include an input terminal coupled to node Q and an output coupled to node QB. The two lines between the inverters may be connected to two separate bit lines (BLs) such as SBL0 and SBL0# via two transistors (left and right of the cell). In some examples, the left bitline SBL0 of each cell pair may be used to write data into a storage cell selected by an active wordline, while the right bitline SBL0# may be used to read the data. In other examples, both SBL and SBL3 may be used for data read and write. The gates of those transistors may be driven by the static wordline (SWL0). In some examples, access to the first memory cell 114 of the nvSRAM device 100 may be enabled by the first word line SWL0 and access to the nth memory cell of the nvSRAM device 100 may be enabled by the nth word line SWLn. The first bit line SBL0 and the second bit line SBL0# may be used as a data bus lines for data transfer during read and/or write operations.

For the sake of simplicity of explanation herein, inversion circuitry will be generally described in the context of various inverters. Other types of inversion circuitry configured to provide inversion capability may be used, alternatively or additionally to inverters. Such other types of inversion circuitry may include, for example, inversion logic configurations and logic gates (NAND, NOR, AND, etc. suitably coupled to provide inversion), analog and/or digital inversion circuits, transmission gates, flip-flops, bistable latches, and/or others.

Various types of transistors may be used in embodiments. The disclosure may use, for purposes of illustration, metal-oxide semiconductor field effect transistors (MOSFET). A MOSFET may have a source terminal (e.g., a first terminal), a drain terminal (e.g., a second terminal), and a control terminal. When an appropriate level of bias signal is applied to the control terminal, the transistor may be activated (e.g., biased into active operation) wherein conduction between the source terminal and the drain terminal may be facilitated. Depending on the type of transistor (e.g., N-type or P-type), an appropriate level of bias signal may be applied, or previously applied bias signal may be removed, to cause the transistor to be deactivated wherein conduction between the source and the drain may be abated. A MOSFET "terminal" may also be termed a "port."

The NVM array 104 having a plurality of NVM memory cells may implemented in a matrix by m rows coupled to a plurality of word lines (e.g., first word line nvWL0, mth word line nvWLm, etc.) and x columns coupled to bit lines (nvBL0 to nvBL0#). In one embodiment, the number of columns may remain same for the SRAM array and the NVM array.

A first NVM cell 110 may include two floating gate field effect transistors (FETs) in a differential configuration. The floating gate memory transistor having a gate region, a source region and a drain region. The transistors may be arranged in parallel in columns with their drain connect to a common drain or bit line, and their source to a common source line.

The gate of the first NVM cell 110 may connected to the word-line nvWL0 and a source to drain (S/D) terminal of the cell may connected to a bit-line nvBL0/nvBL0# and a source-line nvSL0 106. A first set of bit lines may be connected to a drain region of memory transistor in each of the memory cells in a respective column nvBL0. A second set of bit lines may each provide a source line nvSL0 that is electrically connected to a source region of memory transistor in each of the memory cells along a respective column. The common source line nvSL0 and nvSLx may be separated individually or connected together.

One or more of switch devices 106 may be coupled between the SRAM array 102 and the NVM array 104 and configured to control connection between the static random access bit lines (BLs) and the non-volatile BLs through a control signal nvmEN. In one example, the one or more switch devices may include NMOS transistor or PMOS transistor.

Different switch devices may be used to control the connection between the plurality of SRAM cells and the NVM cells. The switch device Ts may connect the SRAM bit line SBL0 with NVM bit line nvBL0 by turning on a control signal nvmEN. The SRAM bit-line SBL0 may be separated from NVM bit-line nvBL0 by turning off the switch device Ts. As a result, the SRAM bit-line loading between SRAM and NVM may be reduced. In addition, the SRAM read/write speed may improve while the power consumption may be reduced. "m" (row number of NVM) may be N times "n" (row number of SRAM), where N is equal or greater than 1.

Figure 2:
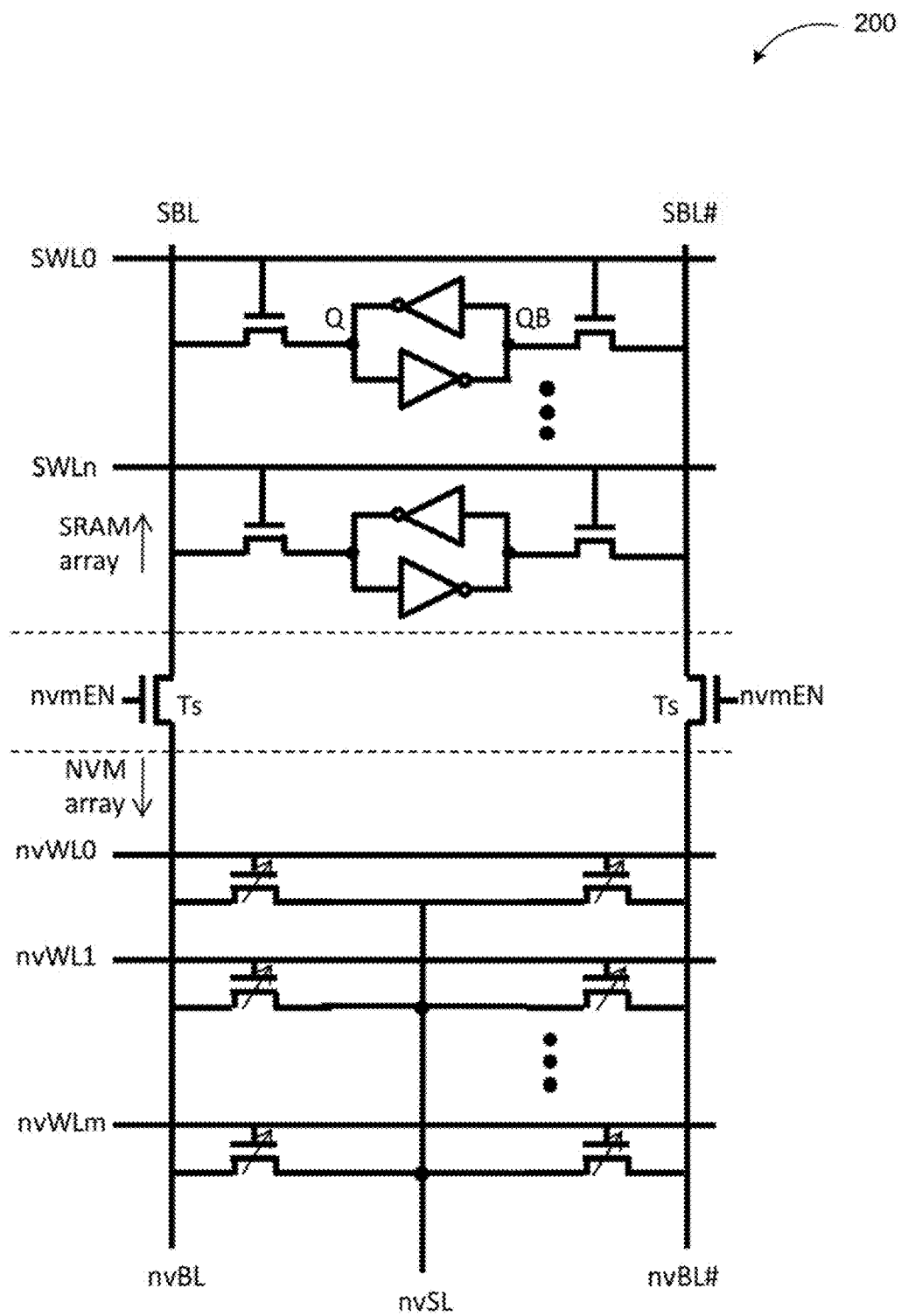
FIG. 2 is a schematic circuit diagram illustrating one column cells of the multi-bit nvSRAM shown in FIG. 1, which has multiple columns.

FIG. 2 is a schematic circuit diagram illustrating one column cells of the multi-bit nvSRAM shown in FIG. 1, which has multiple columns, arranged in accordance with at least some embodiments described herein.

As illustrated in FIG. 2, the device 200 may include a differential pair of the NVM cell for each SRAM cell. The BLs of the SRAM cell may be connected to BLs of the NVM cell through a switch device Ts.

In one embodiment, during operation, the SRAM cell data may be written back to the NVM cell, and the NVM cell data may be loaded into the SRAM cell. Each SRAM cell may read data from the differential pair of the NVM cell and write data to one pair of NVM cell in case a row number of SRAM array equal to the row number of NVM array. In other embodiment, the multi-bit nvSRAM may transfer data between one SRAM row and a fixed NVM row.

In another embodiment, the multi-bit nvSRAM may transfer data between one SRAM row and any one of the NVM rows. Each SRAM cell may read data from multiple NVM cells and write data to multiple NVM cells by implementing more NVM rows along the same BL line pair, where m is several times of n. e.g. m=4*n, each SRAM cell may use 4-bit NVM cell from data storage, the data transfer may between SWL0 and nvWL[3:0], SWL1 and nvWL[7:4].

In one embodiment, the multi-bit nvSRAM may transfer data between 1 SRAM row and a fixed group of NVM rows. E.g. row0 of SRAM corresponding to NVM row[3:0], row1 of SRAM corresponding to NVM row[7:4], etc. the NVM row group may be any rows in the NVM array.

In yet another embodiment, the multi-bit nvSRAM may transfer data between 1 SRAM row and any group of NVM rows. E.g. row0 of SRAM may corresponding to NVM row [3:0], while row1 of SRAM may corresponding to NVM row [7:4] or row0 of SRAM may corresponding to NVM row [7:4], while row1 of SRAM may corresponding to NVM row [11:8]. The NVM row group may be any rows in the NVM array.

The data transfer between SRAM cell and NVM cell is based on row to row transfer. The total operation flow may need n read/write cycles as the SRAM array has n rows. In some configurations, the NVM cell may use a silicon-oxide-nitride-oxide-silicon (SONOS) split gate cell. Split gate memory cells have several advantages over stacked gate memory cells, such as lower power consumption, higher injection efficiency, less susceptibility to short channel effects, and over erase immunity. The NVM cell may not limited to a SONOS cell, but may also be one of a floating gate cell, a eFlash cell, or a pFlash cell.

The nvSRAM device 100 may be powered by a supply voltage Vdd. According to some examples, the logic state of an SRAM cell may be represented by a difference in the voltages of nodes Q and QB. For example, when Q is at the ground voltage, QB may be at the supply voltage Vdd due at least in part by the actions of the cross coupled inverters I1 and I2. This state may be designated as a logic state "0" of an SRAM cell, which may be referred to herein as a logic low state. Conversely when Q is at Vdd, QB may be ground, and this state may be designated as a logic "1" state which may be referred to herein as a logic high state.

A higher threshold voltage (HVt) cell on nvBL and a lower threshold voltage (LVt) cell on nvBL# means a data '0' (Q=0/QB=1), while a lower threshold voltage (LVt) cell on nvBL and a HVt cell on nvBL# means a data '1' (Q=1/QB=0). During operation, to read the data from the NVM cell to SRAM cell, the SRAM bit-line SBL/SBL# and NVM bit-line nvBL/nvBL# may be initialized at ground level before read. Then, the switch device Ts may turn on NVM cell by nvWL and SRAM cell by SWL while the SRAM cell power may be turned off firstly.

The nvBL/nvBL# may be charged up through the NVM cell by applying a Vdd voltage level to nvSL. Finally, SRAM cell power may be ramped up. Due to the different threshold voltage difference Vt between the differential pair of the NVM cell, SBL/SBL# may have a difference and then the data may be latched by the SRAM cell without a sense amplifier.

Data may also be transferred from the SRAM cell to the non-volatile memory cell after the NVM cell has been programmed. In one embodiment, an erase operation must to be executed before program by using tunneling erase operation. To erase the NVM cells, the nvWL may need bias to a negative voltage. A program operation may just bias the nvWL and nvSL to a positive high voltage level and nvBL to a ground level. If a level higher than 1V is applied to nvBL the program may be inhibited. For example, the SRAM cell data is a '1' state, which Q=1 and QB=0, when the SWL is turned on and nvmEN signal, the nvBL/nvBL# may be biased to VDD, the cell on nvBL will not be programmed and the cell on nvBL# is programmed to a HVt state. "m" (row number of NVM) may be N times "n" (row number of SRAM), where N is equal or greater than 1.

Figure 3:
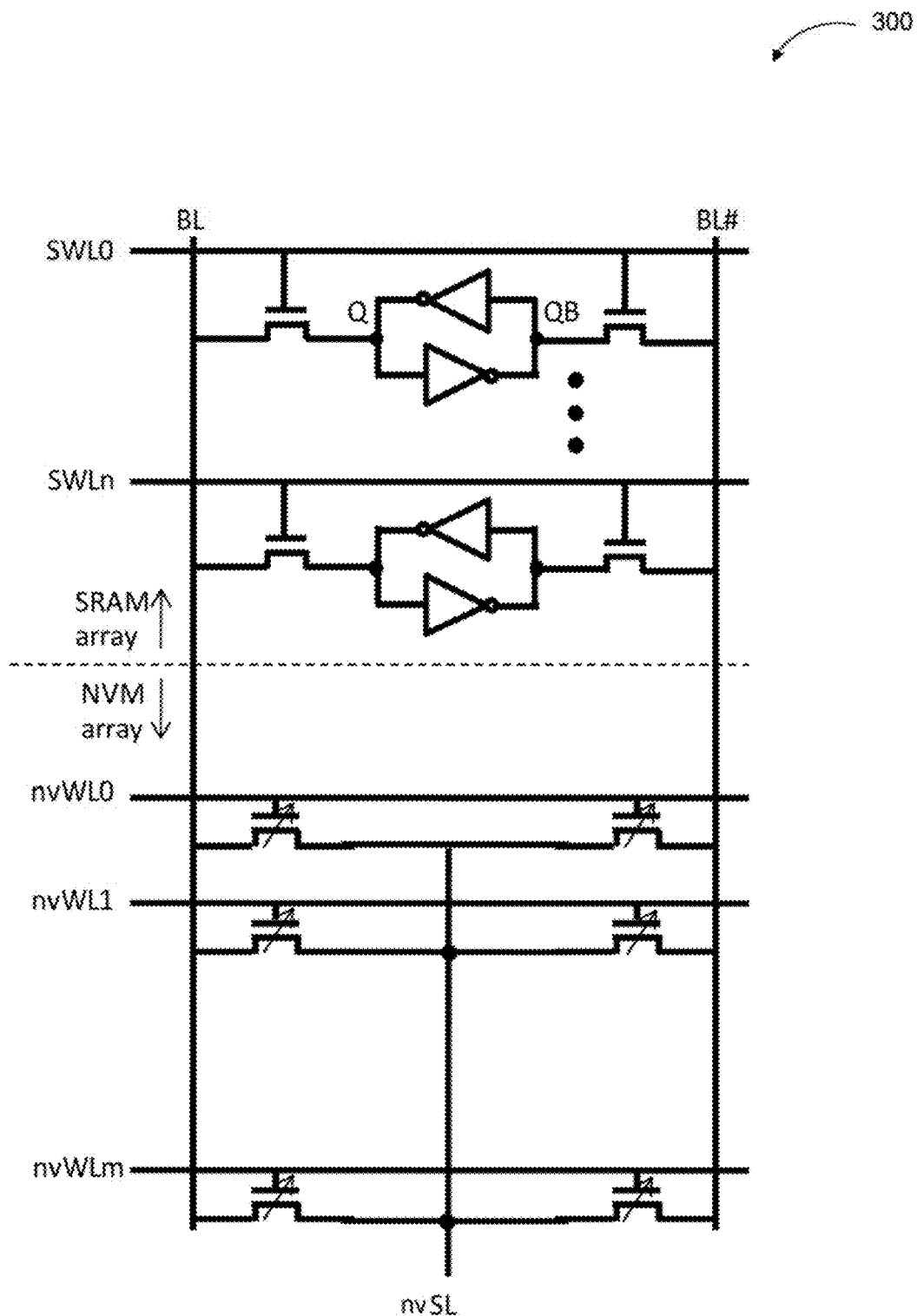
FIG. 3 is a schematic circuit diagram illustrating still another example multi-bit nvSRAM device with arrayed SRAM and NVM sharing bit lines.

FIG. 3 is a schematic circuit diagram illustrating another example multi-bit nvSRAM device with arrayed SRAM and NVM sharing the same bit lines, arranged in accordance with at least some embodiments described herein.

In FIG. 3, SRAM memory cells 302 and NVM memory cells may integrated together in an array sharing the same bit lines. In one embodiment, the switch device coupled between the SRAM array and NVM array may be removed. Due to the integration of both SRAM and NVM memory cells within the same memory array, faster speeds, lower power consumption and less layout area may be provided. "m" (row number of NVM) may be N times "n" (row number of SRAM), where N is equal or greater than 1.

Figure 4:
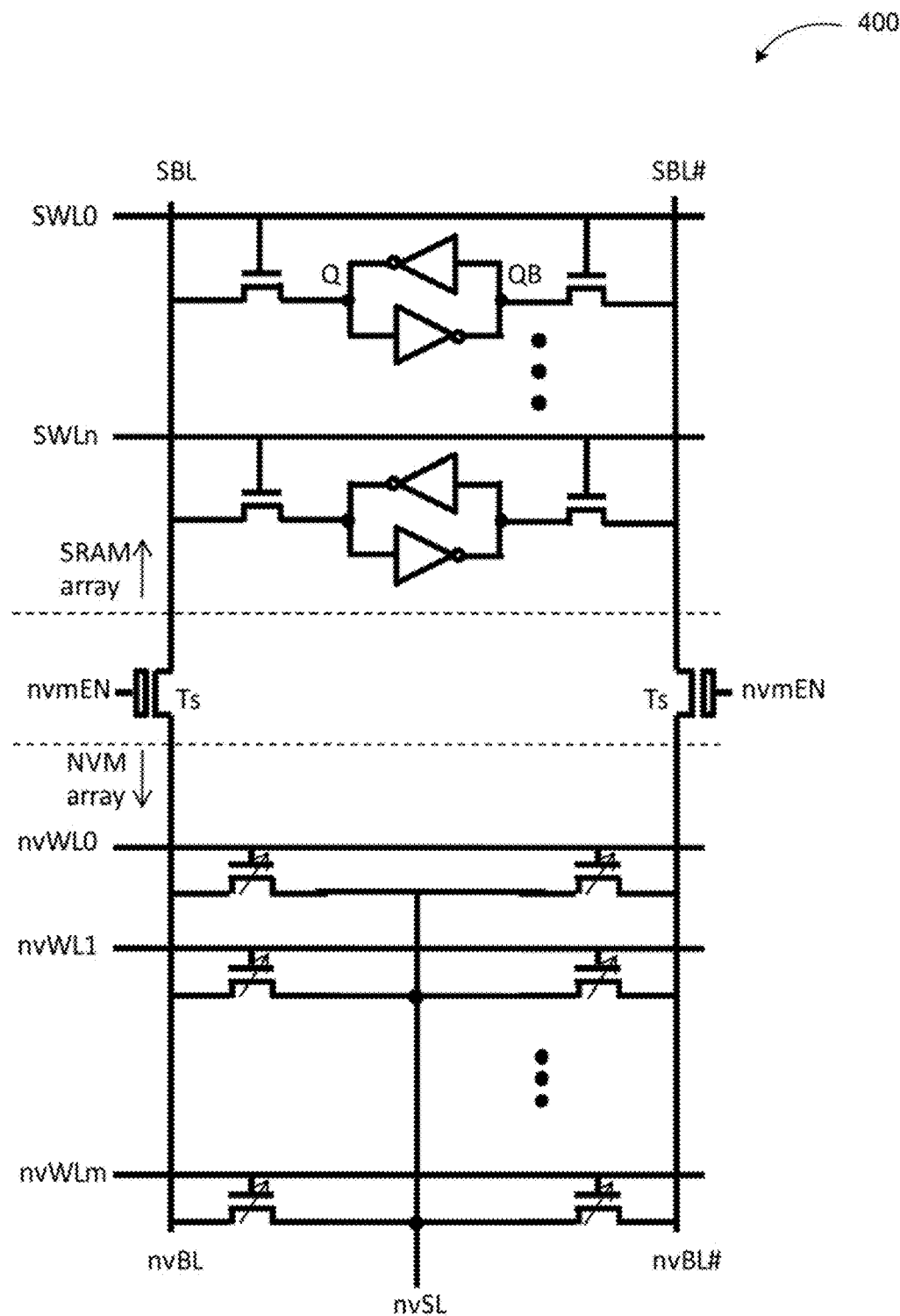
FIG. 4 is a schematic circuit diagram illustrating still another example multi-bit nvSRAM device with arrayed SRAM and NVM coupled with a high voltage device.

FIG. 4 is a schematic circuit diagram illustrating still another example multi-bit nvSRAM device with arrayed SRAM and NVM using a high voltage device, arranged in accordance with at least some embodiments described herein.

In some embodiments, the switch device Ts 404 may use a high voltage (HV) device. The NVM cell may bias the high voltage (higher than VDD) to nvBL/nvBL# for write operation. The HV device Ts may isolate the SRAM bit-line from the high voltage applied to the NVM bit-line. In such embodiments, an extra write driver for NVM bit-line may be needed. "m" (row number of NVM) may be N times "n" (row number of SRAM), where N is equal or greater than 1.

Figure 5:
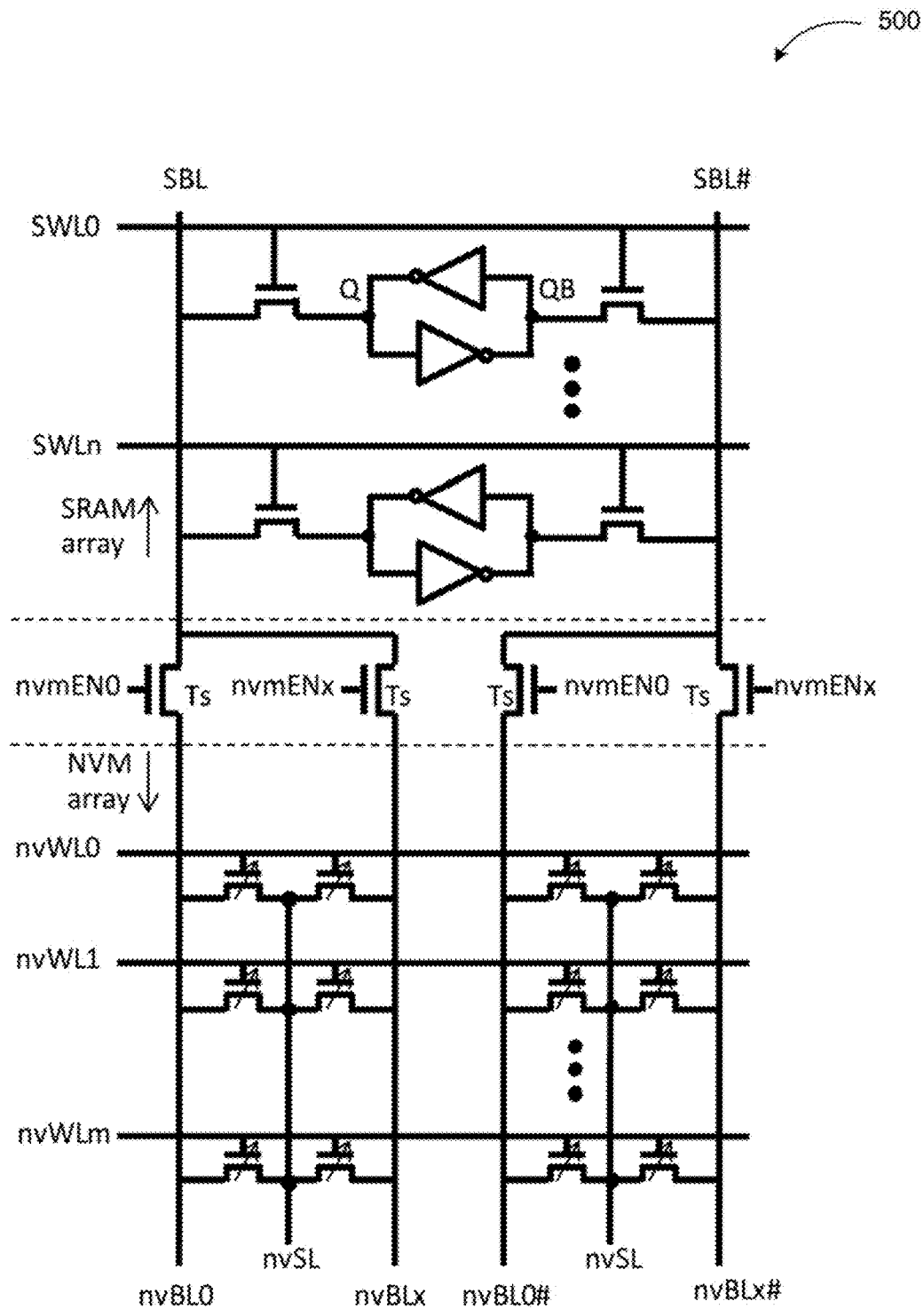
FIG. 5 is a schematic circuit diagram illustrating still another example multi-bit nvSRAM device with arrayed SRAM and NVM.

FIG. 5 is a schematic circuit diagram illustrating still another example multi-bit nvSRAM device with Arrayed SRAM and NVM, arranged in accordance with at least some embodiments described herein.

In one embodiment, the SRAM bit-line SBL may be connected to multiple NVM bit-lines nvBL[x:0], which may be decoded by the select signal nvmEN[x:0]. This structure may be pitch aligned in layout as the NVM cell pitch may be smaller than the SRAM cell in some advanced process.

To read data from the NVM to the SRAM, by enabling a control signal nvmEN0, the differential pair state on nvBL0/nvBL0# may be loaded into the SRAM cell. By enabling another control signal, nvmENx, the differential pair state on nvBLx/nvBLx# may be loaded into the SRAM cell.

To write data from the SRAM to the NVM, a program operation may be executed on nvBL0/nvBL0# by turning on the control signal nvmEN0, while other bit-line such as nvBL/nvBLx# may be floating and the program may be inhibited. "m" (row number of NVM) may be N times "n" (row number of SRAM), where N equal or greater than 1.

Figure 6:
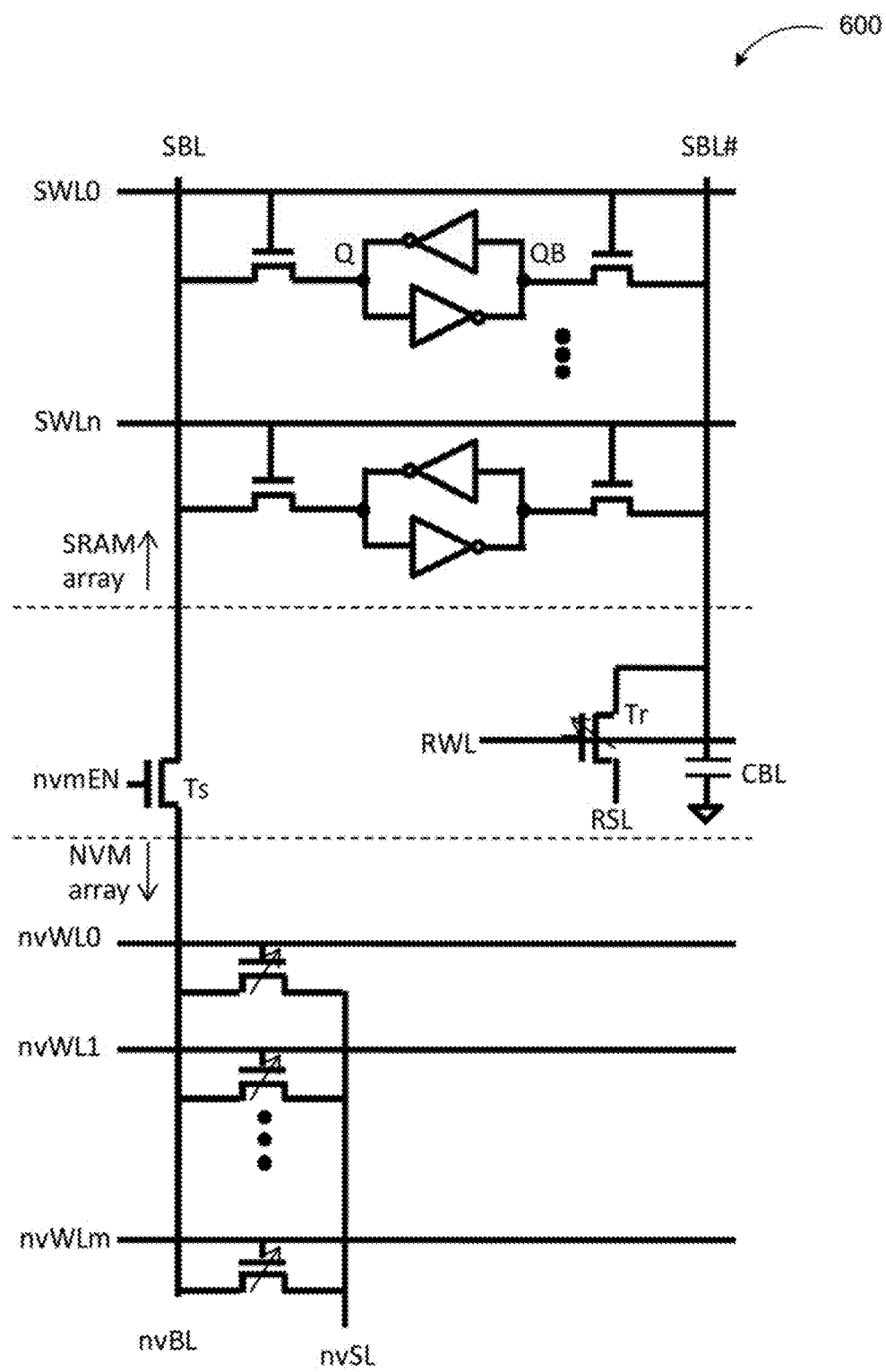
FIG. 6 is a schematic circuit diagram illustrating still another example multi-bit nvSRAM device with arrayed SRAM and NVM.

FIG. 6 is a schematic circuit diagram illustrating still another example multi-bit nvSRAM device with Arrayed SRAM and NVM with adjustable capacitor based implementation, arranged in accordance with at least some embodiments described herein.

In diagram 600, an NVM cell array that may be arranged using single cell structure has been illustrated. An NVM column may be connected with SRAM bit-line SBL through a switch device Ts. A reference cell Tr (with a Vt value between the LVt cell and HVt cell), may be connected with the SRAM bit-line SBL# and the drain side may be tied to reference source line (RSL). The read operation may be started with a VDD level applied to nvSL/RSL and turn on the SRAM cell word-line and NVM cell/reference cell word-line. The SBL may be charged through the NVM cell while SBL# may be charged through the reference cell. The different cell Vt between NVM cell and reference cell may make a voltage difference between SBL and SBL#. Then, ramping up the SRAM power may latch the data without a sense amplifier.

In some embodiments, a bit-line capacitance CBL may tie to the reference side, which may compensate the NVM bit-line loading for SBL/SBL# match. The NVM cell may be connected with SBL#, while the reference cell may be connected with SBL. In some embodiments, the SRAM array and NVM array may be separated with a MOS device Ts, to separate the SRAM bit-line and NVM bit-line, in order to reduce the SRAM bit-line loading, or isolate the high voltage from SRAM bit-line when write NVM cell. A compensate capacitor may be coupled to the NVM reference side to match the NVM bit-line loading between the cell side and the reference side.

In the single cell structure, the SRAM bit-line SBL may also be connected to multiple NVM bit-lines for layout pitch alignment. In the single cell structure, the NVM cell may include a single-level cell (SLC) or a multi-level cell (MLC) cell. However, a complex read/write flow may be needed when use the MLC cell. "m" (row number of NVM) may be N times "n" (row number of SRAM), where N is equal or greater than 1.

Figure 7:
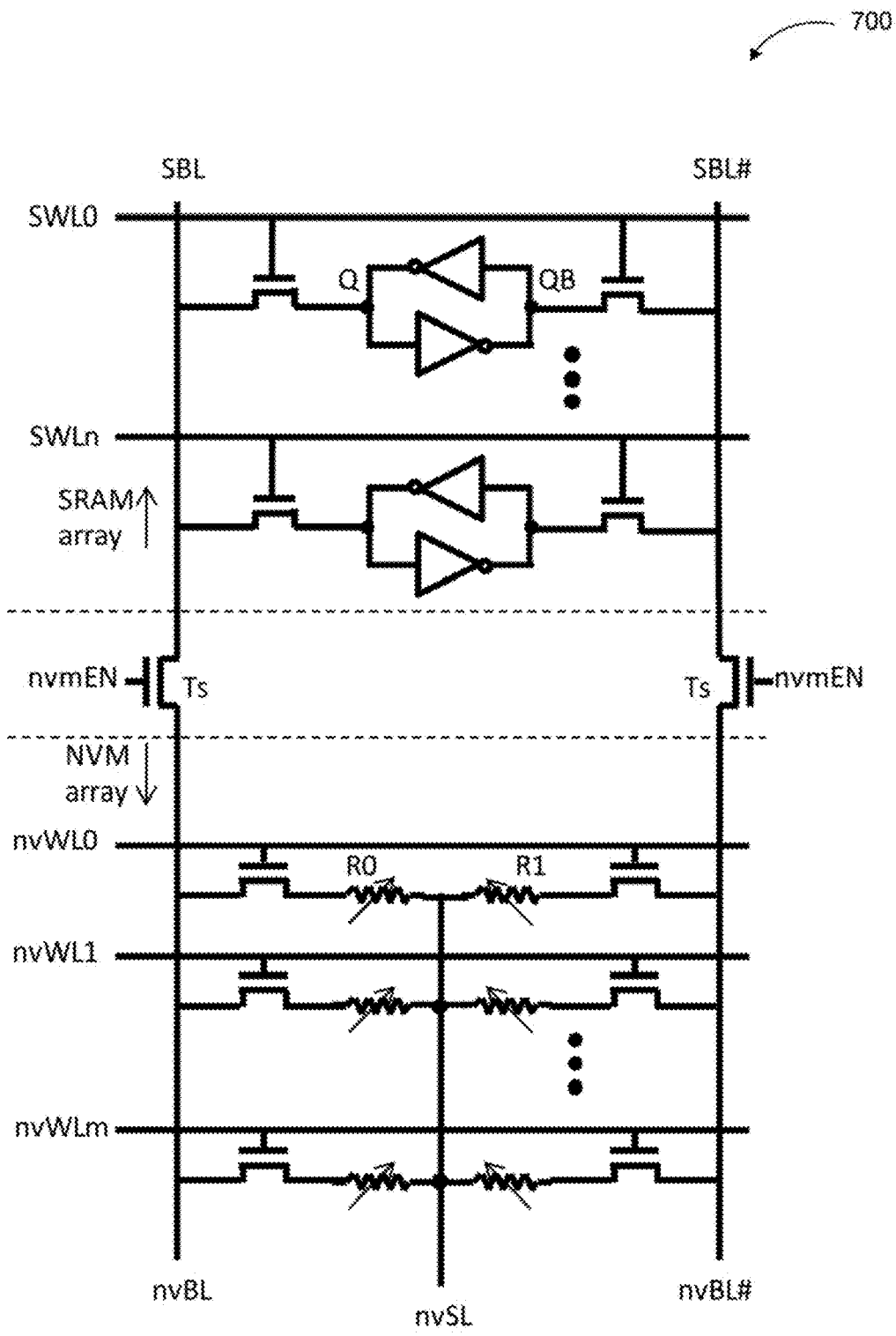
FIG. 7 is a schematic circuit diagram illustrating still another example multi-bit nvSRAM device with arrayed SRAM and NVM.

FIG. 7 is a schematic circuit diagram illustrating still another example multi-bit nvSRAM device with Arrayed SRAM and NVM with adjustable resistor based implementation, arranged in accordance with at least some embodiments described herein.

In diagram 700, the top NVM cell may be a 1T1R cell that includes a transistor and a programmable resistor. The source-line nvSL may be a common line or a separated signal line for each column of the NVM array. The programmable resistor may be programmed to at least two resistance states, a LRS (low resistance state) and a HRS (high resistance state). In one embodiment, the programmable resistor may be a MRAM device. e.g. a STT MTJ device (a spin transfer torque magnetic tunnel junction resistor).

During operation, a voltage (equal to VDD, or higher than VDD in some examples) may be applied to nvSL, and nvBL/nvBL# may be pulled to ground while nvWL0 is active. Both R0 and R1 may be turned to the LRS state. A voltage (VDD for example) may be applied to nvBL, and ground level to nvSL. R0 may be turned to a HRS state by turning on nvWL0. R1 may be turned to HRS state by applying nvBL# to VDD, nvSL to ground and nvWL0 to VDD.

Before data transfer from SRAM to NVM, nvSL may biased to a VDD level or a higher level and nvBL/nvBL# may initialized at a ground level. Active the nvWL may turn the MTJ device to a LRS state. Then, nvSL may be biased to a ground level, active SRAM word-line, Ts and NVM word-line, SRAM cell may drive nvBL/nvBL# to a logic '0' or '1' level. For example, Q=1/QB=0, nvBL may be at VDD while nvBL# at ground level. R0 may be turned to a HRS state while R1 is kept at the LRS state and vice-versa, Q=0/QB=1 will turn R1 to HRS state while R0 keep a LRS state.

During operation, to transfer the data from NVM to SRAM, the SRAM word-line, Ts and NVM WL may be activated, then the SRAM power ramped up. The data '1' will be latched when R0/R1 at a HRS/LRS state, and a data '0' will be latched when R0/R1 at a LRS/HRS state. The NVM word-line may be biased at a level lower than VDD to get a low read level to reduce the disturb. "m" (row number of NVM) may be N times "n" (row number of SRAM), where N is equal or greater than 1. The programmable resistor element is not limited to MRAM, but also can be a PCRAM, FeRAM, RRAM and so on.

Figure 8:
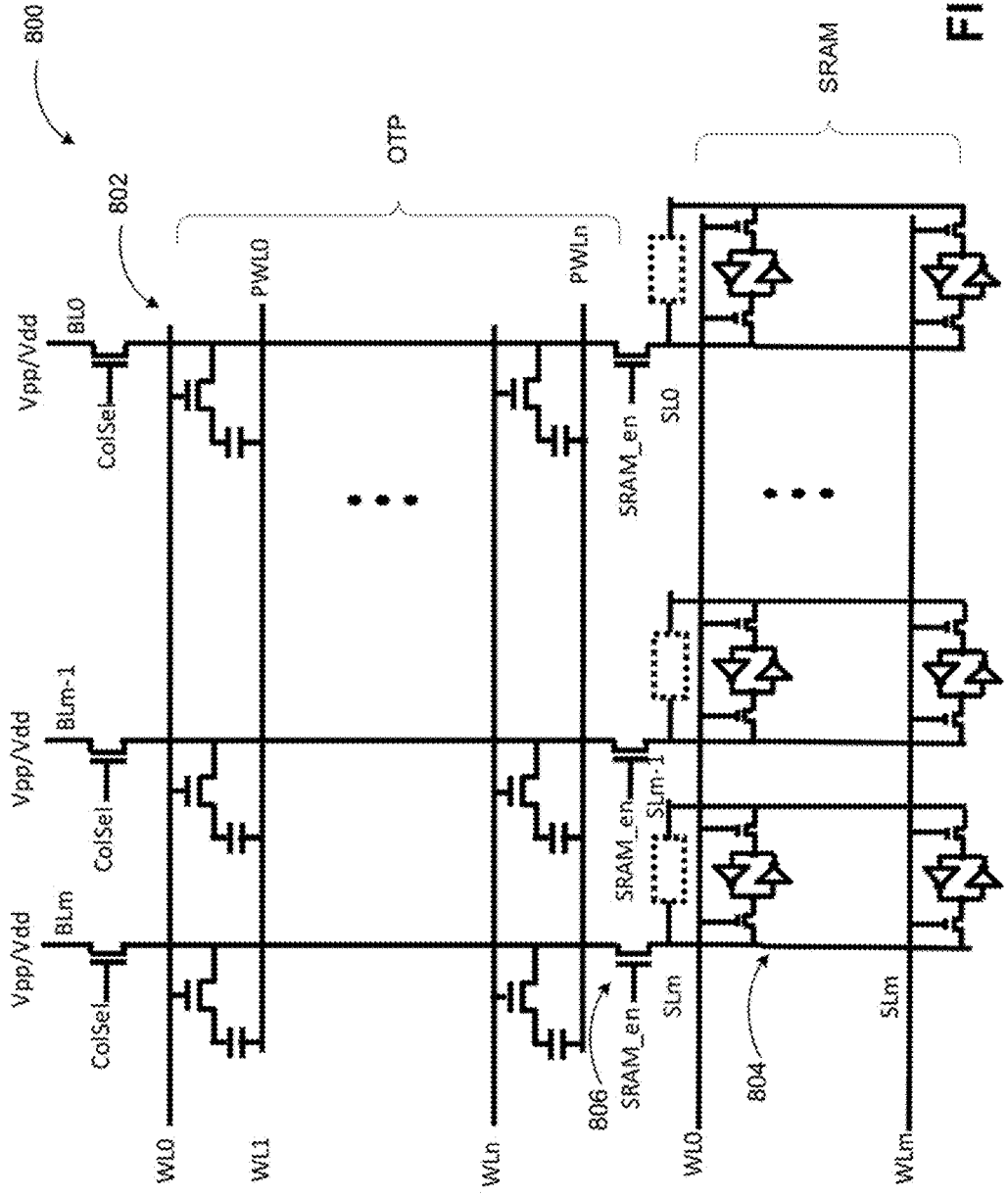
FIG. 8 is a schematic circuit diagram illustrating a memory device with arrayed OTP memory and SRAM.

FIG. 8 is a schematic circuit diagram illustrating example a memory device with arrayed OTP and SRAM, arranged in accordance with at least some embodiments described herein One-time programmable memories provide a type of non-volatile memory that are capable of writing data only once. These may be widely used for an integrated circuit (IC) chip as a single memory or a memory array. There are several types of OTP memory technologies that may be embedded on chips such as flash, eFuse, and Erasable Programmable Read-Only Memory (EPROM). Example structures may be extended to include MTP (multiple-time memory) as well. RRAM refers to 1T/1R resistive RAM, may include ReRAM, Phase change memory, Ferroelectric RAM, magnetic RAM.

In diagram 800, an array may comprise an OTP array 802, a SRAM array 804, and a switch circuit 806 coupled between the OTP array and the SRAM array. The OTP memory array 802 may include a plurality of bit lines (BLm-BL0), a plurality of word lines (WL0-WLn); a plurality of capacitors, which may be disposed in correspondence with the plurality of word lines; and a plurality of memory cells comprising a plurality of transistors and capacitors disposed at cross points of the plurality of bit lines and the plurality of word lines.

The SRAM array 804 may have a plurality of SRAM memory cells. An SRAM cell may be made up of two transistors and a cross coupled inverter as described above in FIG. 1. Each memory cell of an SRAM memory cell circuit is connected to the bit-line of the OTP array through a switch circuit 806. Each Word line and bit line of the OTP array may be connected to a high voltage Vpp. During program operation, in read mode, Vdd may be applied to the WL.

Figure 9:
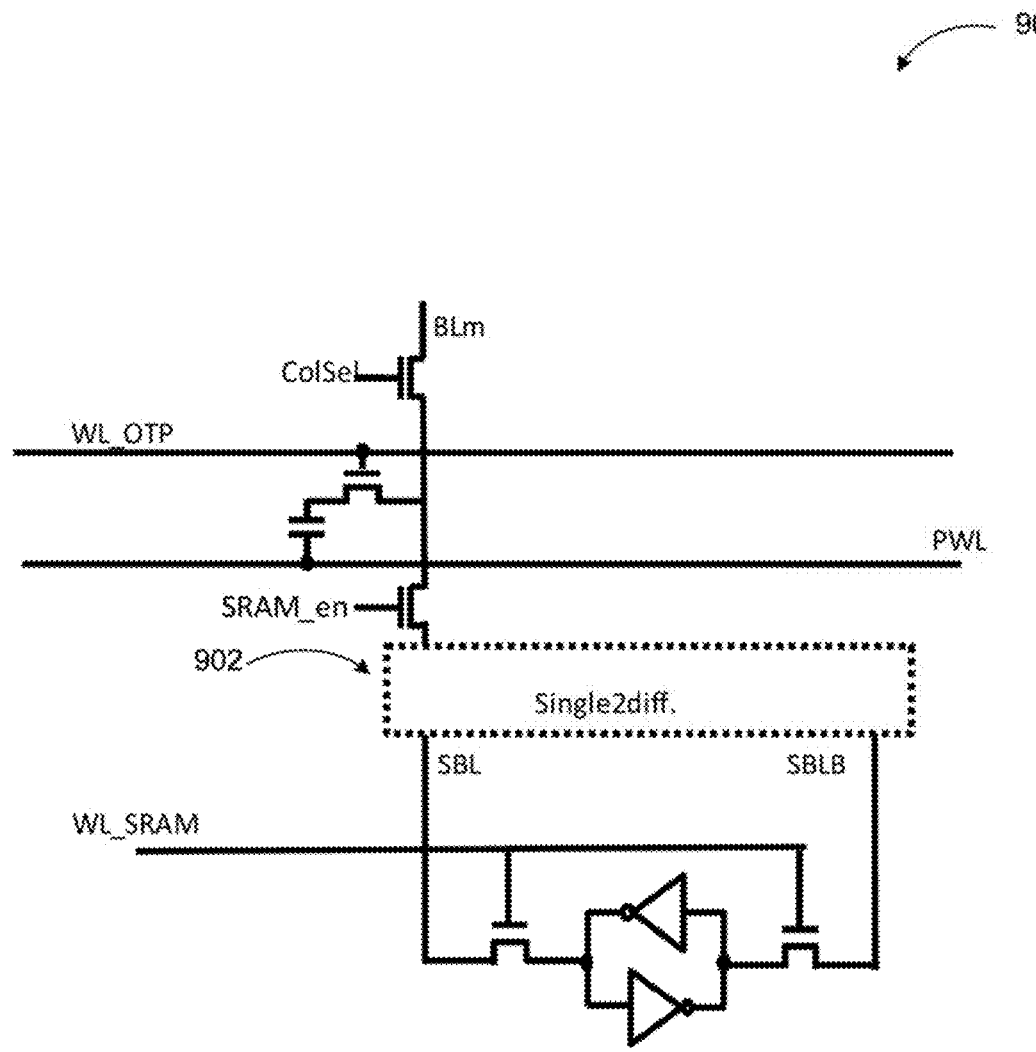
FIG. 9 is a schematic circuit diagram illustrating is a schematic circuit diagram illustrating still another example memory device with arrayed OTP memory and SRAM.

FIG. 9 is a schematic circuit diagram illustrating cell based SRAM OTP showing single-ended signal input conversion to differential signal, arranged in accordance with at least some embodiments described herein.

As illustrated, the device in diagram 900 may be similar to the device of FIG. 8 but may include a converter circuit 902 to convert a single ended signal to differential signal provided to be stored in memory, a reference circuit may be needed in the single to differential convertor.

Figure 10:
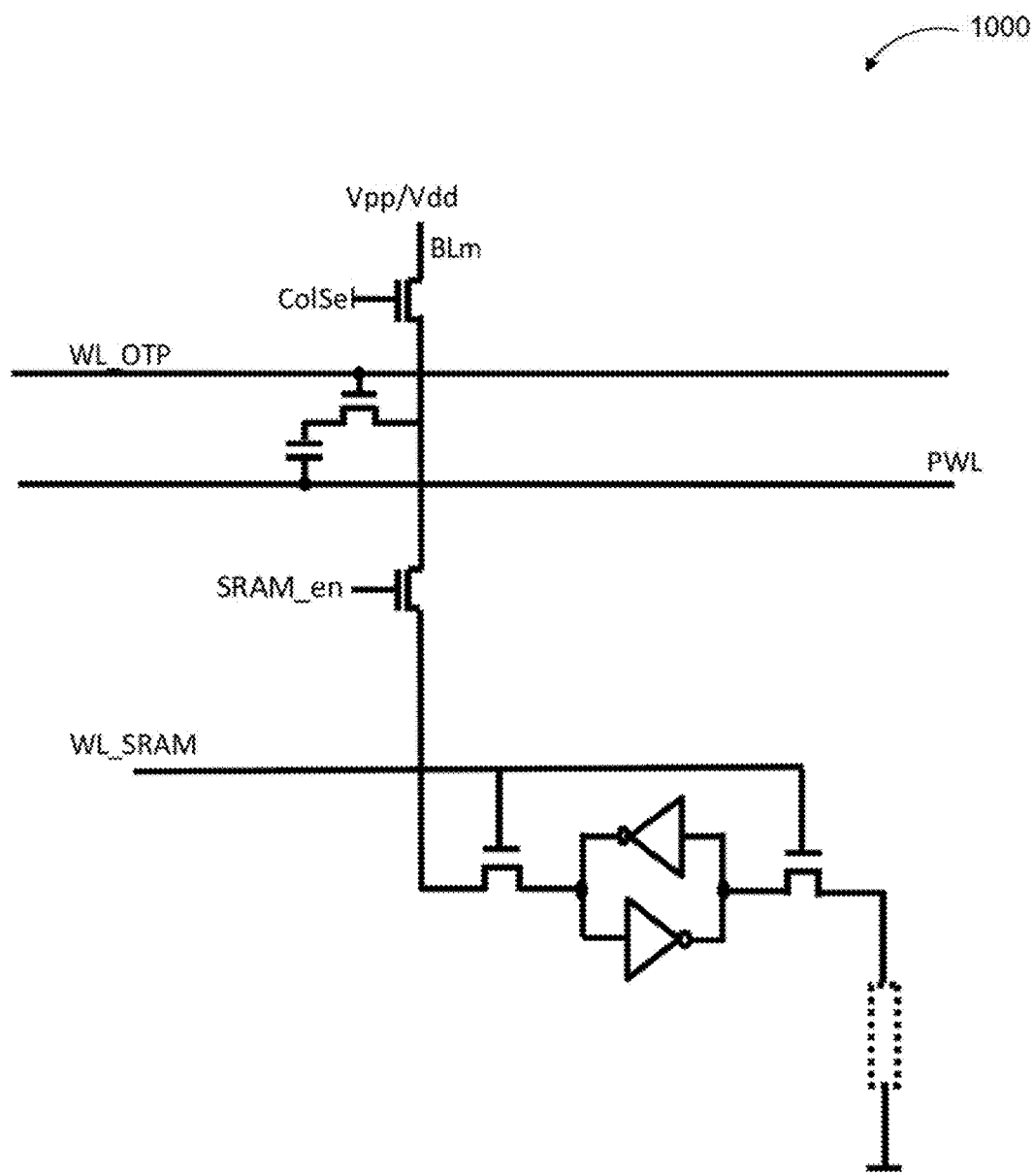
FIG. 10 is a schematic circuit diagram illustrating still another example memory device with arrayed OTP memory and SRAM.

FIG. 10 is a schematic circuit diagram illustrating still another example cell based SRAM OTP using reference current source, arranged in accordance with at least some embodiments described herein.

As illustrated, the device in diagram 1000 may be similar to the device of FIG. 8, but may include a reference current source provided to store the data in SRAM cells. Extra differential reference may not be needed in this configuration.

Figure 11:
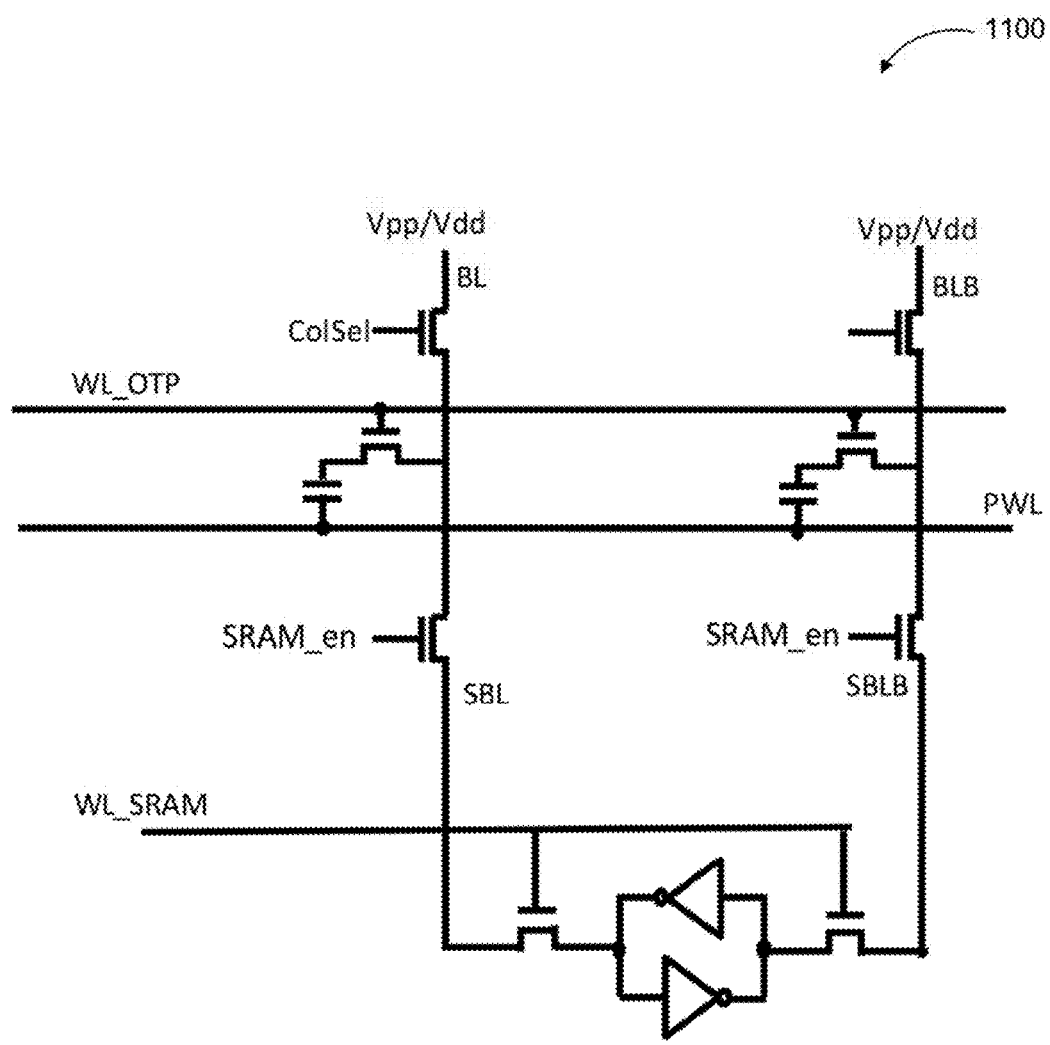
FIG. 11 is a schematic circuit diagram illustrating still another example memory device with arrayed OTP memory and SRAM.

FIG. 11 is a schematic circuit diagram illustrating cell based SRAM OTP based on capacitance, arranged in accordance with at least some embodiments described herein.

As illustrated, the device in diagram 1100 may be similar to the device of FIG. 8 with a differential OTP cell based configuration as shown in the circuit diagram.

Figure 12:
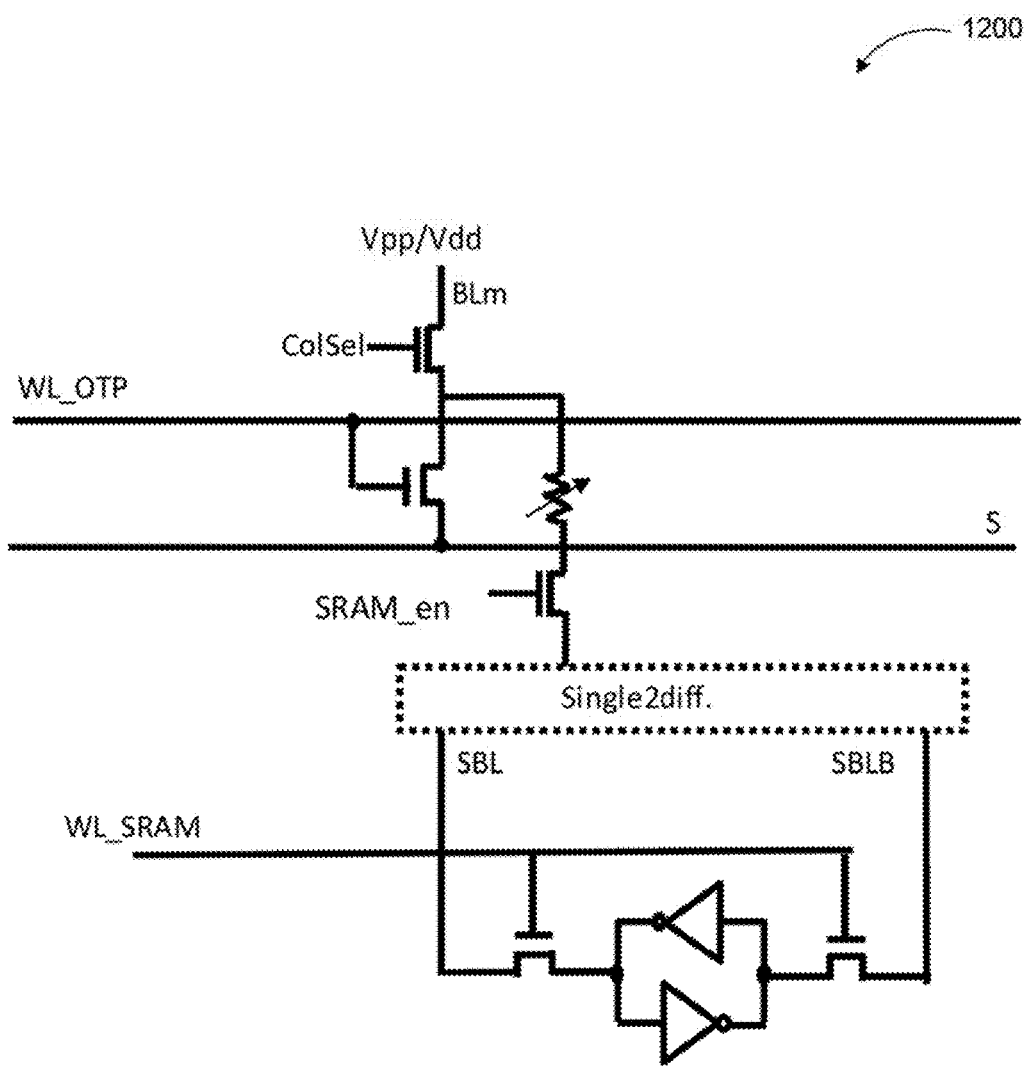
FIG. 12 is a schematic circuit diagram illustrating example memory device with arrayed OTP and SRAM.

FIG. 12 is a schematic circuit diagram illustrating cell based SRAM RRAM, arranged in accordance with at least some embodiments described herein.

As illustrated, the device in diagram 1200 may be similar to the device of FIG. 8 with a resistor circuit provided to store the data in SRAM cells. Write operations (frequent) may be performed on the SRAM with writes on RRAM only as backup. Less writes on RRAM may solve the large write current issue in RRAM.

Figure 13:
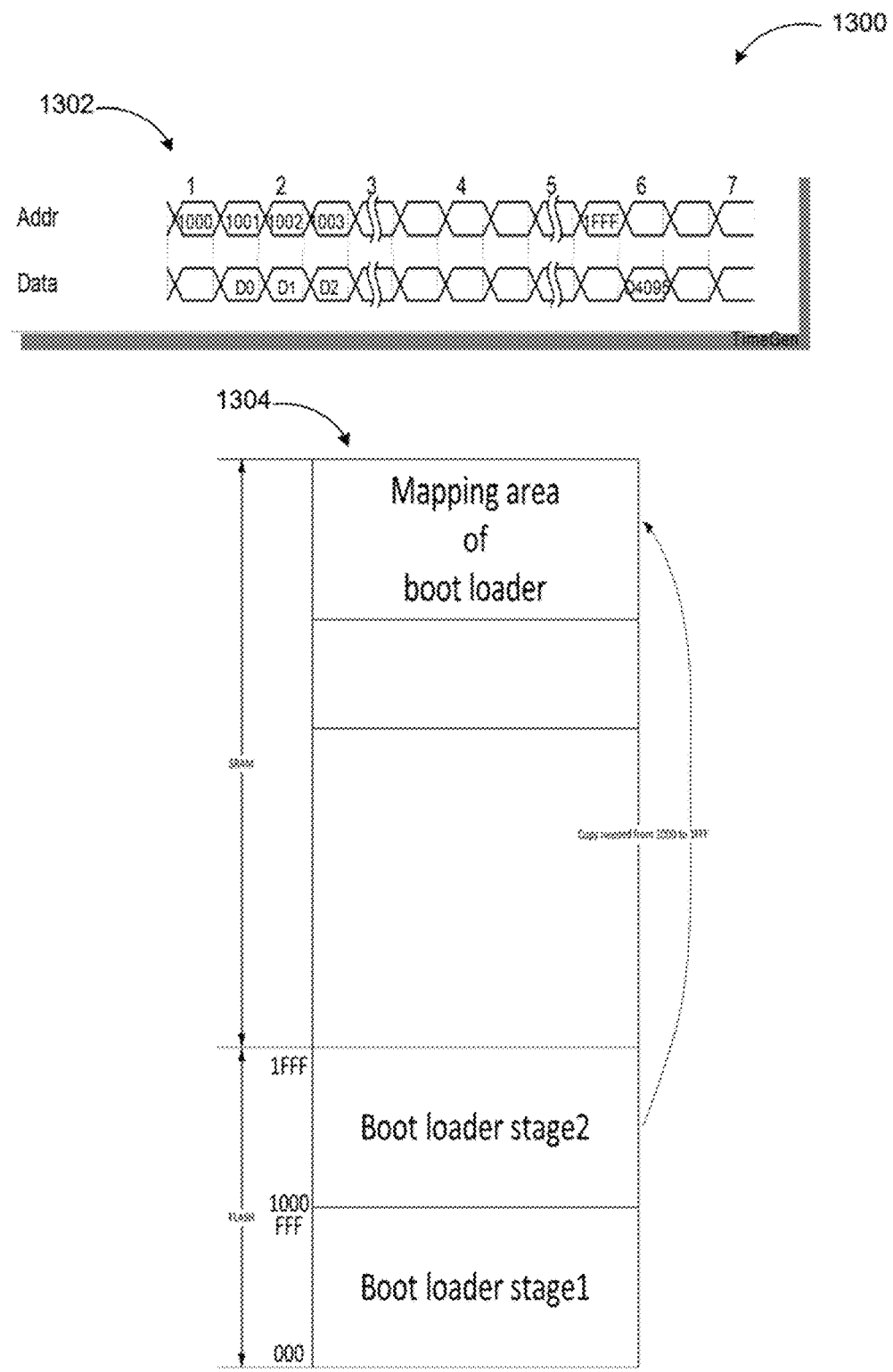
FIG. 13 is a block diagram illustrating OTP data move to SRAM area.

FIG. 13 is a block diagram illustrating OTP data move to SRAM area, arranged in accordance with at least some embodiments described herein.

As illustrated in diagram 1300, read/write operations include addresses and data 1302. A portion of the flash memory array may be employed to store bootcode of a bootloader 1304. Bootloader may be divided into two stages: boot loader stage1 and boot loader stage2. The first stage may start from lowest memory address 000 and end at address FFF. The second stage may start from address 1000 and end at addresses 1FFF. In conventional systems, data transfer from OTP memory area to SRAM may require 4096 cycle periods. In addition, long data transfer times may also result in a large power consumption. The data transfer time may thus be undesirably long and the total power consumed may be undesirably too large.

Figure 14:
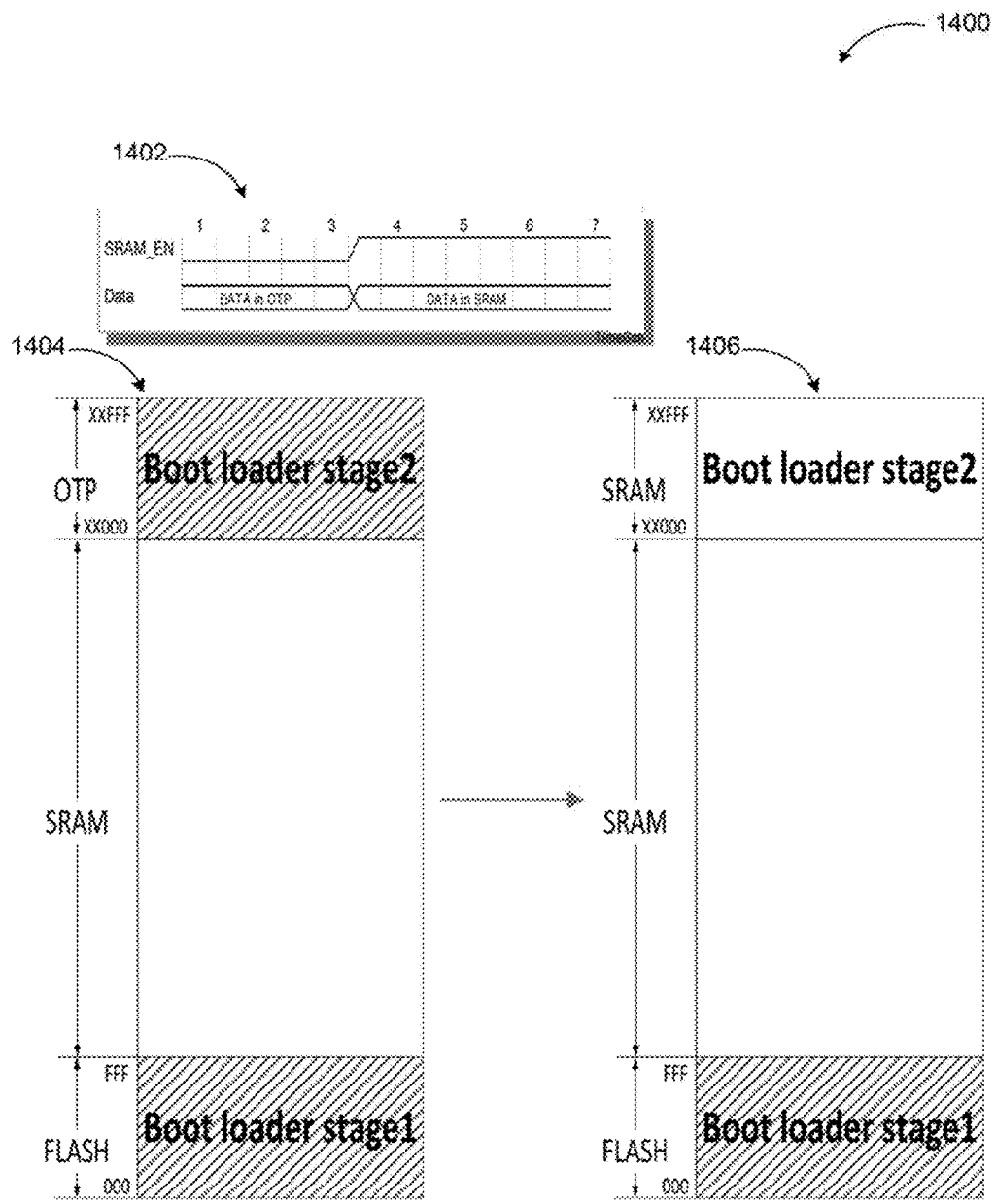
FIG. 14 is a block diagram illustrating cell based SRAM-OTP configurations eliminating memory copying.

FIG. 14 is a block diagram illustrating cell based SRAM-OTP configurations eliminating memory copying.

By using the SRAM-OTP combination as described herein, OTP and SRAM may be switched through an SRAM enable signal 1402 and copying the data from OTP to SRAM in one cycle (1404, 1406), large number of cycles (e.g., 4 k) may no longer be needed reducing data move time and power consumption.

Some embodiments are directed to example processes to operate a multi-bit non-volatile SRAM devices and/or SRAM buffered OTP devices. The operations of any process described herein are not necessarily presented in any particular order and that performance of some or all of the operations in an alternative order(s) is possible and is contemplated. The operations have been presented in the demonstrated order for ease of description and illustration. Operations may be added, combined, modified, omitted, and/or performed simultaneously, in a different order, etc., without departing from the scope of the present disclosure.

The illustrated process can be ended at any time and need not be performed in its entirety. Some or all operations of the processes, and/or substantially equivalent operations, can be performed by execution by one or more processors of computer-readable instructions included on a computer storage media, such as described herein, including a tangible non-transitory computer-readable storage medium. The term "computer-readable instructions," and variants thereof, as used in the description and claims, is used expansively herein to include routines, applications, application modules, program modules, programs, components, data structures, algorithms, or the like. Computer-readable instructions can be implemented on various system configurations, including single-processor or multiprocessor systems, minicomputers, mainframe computers, personal computers, hand-held computing devices, microprocessor-based, programmable consumer electronics, combinations thereof, or the like.

Figure 15:
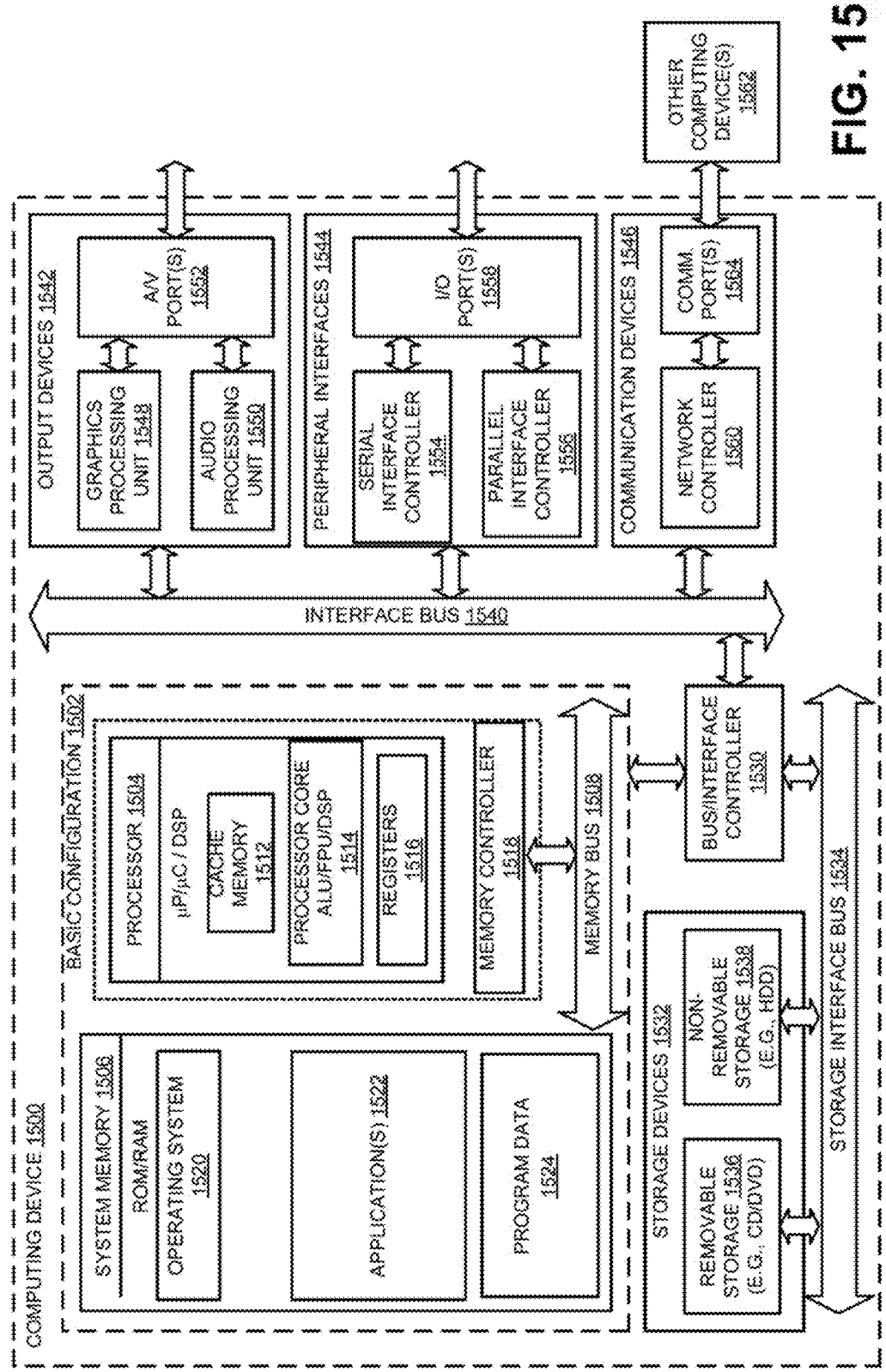
FIG. 15 is a block diagram illustrating an example computing device that is arranged for implementing SRAM based memory structures discussed herein.

FIG. 15 is a block diagram illustrating an example computing device 1500 that is arranged to incorporate or operate SRAM based memory structures, in accordance with at least some embodiments described herein. In a very basic configuration 1502, computing device 1500 typically includes one or more processors 1504 and system memory 1506. A memory bus 1508 can be used for communicating between the processor 1504 and the system memory 1506.

Depending on the desired configuration, processor 1504 can be of any type including but not limited to a microprocessor (µP), a microcontroller (µC), a digital signal processor (DSP), or any combination thereof. Processor 1504 can include one more levels of caching, such as cache memory 1512, a processor core 1514, and registers 1516. The processor core 1514 can include an arithmetic logic unit (ALU), a floating point unit (FPU), a digital signal processing core (DSP core), or any combination thereof. A memory controller 1518 can also be used with the processor 1504, or in some implementations the memory controller 1515 can be an internal part of the processor 1504.

Depending on the desired configuration, the system memory 1506 can be of any type including but not limited to volatile memory (such as RAM), non-volatile memory (such as ROM, flash memory, etc.) or any combination thereof. System memory 1506 typically includes an operating system 1520, one or more applications 1522, and program data 1524.

Computing device 1500 can have additional features or functionality, and additional interfaces to facilitate communications between the basic configuration 1502 and any required devices and interfaces. For example, a bus/interface controller 1540 can be used to facilitate communications between the basic configuration 1502 and one or more data storage devices 1532 via a storage interface bus 1534. The data storage devices 1532 can be removable storage devices 1536, non-removable storage devices 1538, or a combination thereof. Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media can include volatile and nonvolatile, removable and non-removable media implemented in any method or technology for storage of information, such as computer readable instructions, data structures, program modules, or other data.

System memory 1506, removable storage 1536 and non-removable storage 1538 are all examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which can be used to store the desired information and which can be accessed by computing device 1500. Any such computer storage media can be part of device 1500. Thus, any of the computer storage media may be implemented using the SRAM based memory structures as discussed herein.

Computing device 1500 can also include an interface bus 1540 for facilitating communication from various interface devices (e.g., output interfaces, peripheral interfaces, and communication interfaces) to the basic configuration 1502 via the bus/interface controller 1530. Example output devices 1542 include a graphics processing unit 1548 and an audio processing unit 1550, which can be configured to communicate to various external devices such as a display or speakers via one or more A/V ports 1552. Example peripheral interfaces 1544 include a serial interface controller 1554 or a parallel interface controller 1556, which can be configured to communicate with external devices such as input devices (e.g., keyboard, mouse, pen, voice input device, touch input device, etc.) or other peripheral devices (e.g., printer, scanner, etc.) via one or more I/O ports 1558. An example communication device 1546 includes a network controller 1560, which can be arranged to facilitate communications with one or more other computing devices 1562 over a network communication via one or more communication ports 1564. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, communication media can include wired media such as a wired network or direct-wired connection, and wireless media such as acoustic, radio frequency (RF), infrared (IR) and other wireless media. The term computer readable media as used herein can include both storage media and communication media.

Computing device 1500 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 1500 can also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope. Functionally equivalent methods and apparatuses within the scope of the disclosure, in addition to those enumerated herein, are possible. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, compounds, or compositions, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" term (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include, but not be limited to, systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

Further, the use of the terms "first," "second," "third," "fourth," and the like is to distinguish between repeated instances of a component or a step in a process and does not impose a serial or temporal limitations unless specifically stated to require such serial or temporal order.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc.

As a non-limiting example, each range discussed herein can be readily broken down into a lower third, middle third and upper third, etc. As will also be understood by one skilled in the art all language such as "up to," "at least," "greater than," "less than," or the like include the number recited and refer to ranges which can be subsequently broken down into subranges as discussed above. Finally, as will be understood by one skilled in the art, a range includes each individual member. Thus, for example, a group having 1-3 elements refers to groups having 1, 2, or 3 elements. Similarly, a group having 1-5 elements refers to groups having 1, 2, 3, 4, or 5 elements, and so forth.

While various aspects and embodiments have been disclosed herein, other aspects and embodiments are possible. The various aspects and embodiments disclosed herein are for purposes of illustration and are not intended to be limiting, with the true scope and spirit being indicated by the following claims.

What is claimed is:

1. A multi-bit non-volatile static random access memory (nvSRAM) device, comprising:
   a static random access memory (SRAM) array having a plurality of SRAM cells arranged by rows of word lines and columns of bit lines;
   a non-volatile memory (NVM) array having a plurality of NVM cells arranged in a column; and
   one or more of switch devices coupled between one side of the SRAM array and the NVM array and configured to control connection between SRAM bit lines (BLs) and the NVM array, wherein another side of each of the SRAM columns is coupled to a reference circuit comprising a transistor device configured as an NVM cell with a source terminal coupled to an SRAM BL and a drain terminal coupled to a reference source line, and a capacitor coupled between the SRAM BL and a ground reference.

2. The multi-bit nvSRAM device of claim 1, wherein at least a portion of control gates of the SRAM cells are coupled to a same SRAM word line (WL), and wherein one or more sources and one or more drains of at least some of the SRAM cells are coupled to the SRAM bit lines (BL).

3. The multi-bit nvSRAM device of claim 2, wherein data of one row of SRAM cells are transferred to or from one of N rows of NVM cells connected to the one row of SRAM cells with N greater or equal to 1.

4. The multi-bit nvSRAM device of claim 1, wherein the NVM cells are arranged in a single cell configuration.

5. The multi-bit nvSRAM device of claim 1, wherein at least a portion of control gates of the NVM cells are coupled to a same NVM word line (WL), and wherein one or more sources and one or more drains of at least some of the NVM cells are coupled to the NVM bit line (BL) and a source line (SL).

6. The multi-bit nvSRAM device of claim 1, wherein the one or more switch devices include a NMOS transistor or a PMOS transistor.

7. The multi-bit nvSRAM device of claim 1, wherein the one or more switch devices are turned on to facilitate a data transfer between the SRAM cells and the NVM cells.

8. The multi-bit nvSRAM device of claim 1, wherein the one or more switch devices are turned off to disconnect the SRAM BL from the NVM BL.

9. The multi-bit nvSRAM device of claim 1, wherein at least one of the NVM cells includes a SONOS split gate cell, a floating gate cell, an eFlash cell, a pFlash cell, a 1T/1R resistive RAM, a resistive memory based cell, a phase change memory based cell, a ferroelectric RAM based cell, or a magnetic RAM based cell.

10. The multi-bit nvSRAM device of claim 1, wherein SRAM bit-line loading is separated from NVM bit-line using the one or more switch devices such that a read/write speed of the multi-bit nvSRAM device is increased and a read/write current of the multi-bit nvSRAM device is reduced.

11. The multi-bit nvSRAM device of claim 1, wherein each of the NVM cells comprises a switch device and a nonvolatile memory device with different memorized states.

12. The multi-bit nvSRAM device of claim 1, wherein each of the NVM cells comprises a nonvolatile memory device with different memorized states.

13. The multi-bit nvSRAM device of claim 1, wherein the one side of each SRAM BL is charged through the NVM column and the other side of each SRAM BL is charged through the reference circuit.

* * * * *